United States Patent
Chan et al.

(10) Patent No.: US 9,661,779 B2
(45) Date of Patent: May 23, 2017

(54) CONTAINER DATA CENTER

(71) Applicant: HON HAI PRECISION INDUSTRY CO., LTD., New Taipei (TW)

(72) Inventors: Hung-Chou Chan, New Taipei (TW); Wen-Tang Peng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 28 days.

(21) Appl. No.: 14/586,044

(22) Filed: Dec. 30, 2014

(65) Prior Publication Data

US 2016/0157385 A1    Jun. 2, 2016

(30) Foreign Application Priority Data

Nov. 28, 2014    (CN) .......................... 2014 1 0701645

(51) Int. Cl.
*H05K 7/00* (2006.01)
*H05K 7/14* (2006.01)
*H05K 7/20* (2006.01)

(52) U.S. Cl.
CPC ....... *H05K 7/1497* (2013.01); *H05K 7/20709* (2013.01); *H05K 7/20745* (2013.01)

(58) Field of Classification Search
None
See application file for complete search history.

(56) References Cited

U.S. PATENT DOCUMENTS

| 4,258,967 | A | * | 3/1981 | Boudreau | ............ | H05K 7/1421 |
| | | | | | | 312/273 |
| 9,377,808 | B1 | * | 6/2016 | Sivertsen | .................. | G06F 1/16 |
| 2007/0252494 | A1 | * | 11/2007 | Freedenberg | .......... | A47B 67/04 |
| | | | | | | 312/334.4 |
| 2009/0267466 | A1 | * | 10/2009 | Zook | ....................... | E05C 9/043 |
| | | | | | | 312/223.6 |
| 2009/0289537 | A1 | * | 11/2009 | Cabal Velarde | ... | A47B 88/0055 |
| | | | | | | 312/408 |
| 2011/0279956 | A1 | * | 11/2011 | Sun | ...................... | H05K 7/1489 |
| | | | | | | 361/679.02 |

FOREIGN PATENT DOCUMENTS

| JP | 2002-261474 | 9/2002 |
| JP | 2013-200762 | 10/2013 |

* cited by examiner

*Primary Examiner* — Courtney Smith
*Assistant Examiner* — Zhengfu Feng
(74) *Attorney, Agent, or Firm* — Steven Reiss

(57) ABSTRACT

A container data center includes a cabinet and a function module. The cabinet includes a plurality of sides and a bottom. A first one of the sides defines a plurality of spaced openings. At least one door is rotatably attached to the side beside each opening. A support member is rotatably attached to the sides near a bottom edge of each opening. The door and the support members are rotated to open each opening and the support members are aligned with the bottom to allow the function modules to slide on the bottom and the support members.

10 Claims, 5 Drawing Sheets

CONTAINER DATA CENTER

FIELD

The subject matter herein generally relates to a container data center.

BACKGROUND

A container data center is configured with cooling devices installed in a cabinet of the container data center for heat dissipation, which occupies much space of the cabinet.

BRIEF DESCRIPTION OF THE DRAWINGS

Implementations of the present technology will now be described, by way of example only, with reference to the attached figures.

DETAILED DESCRIPTION

Figure 1:
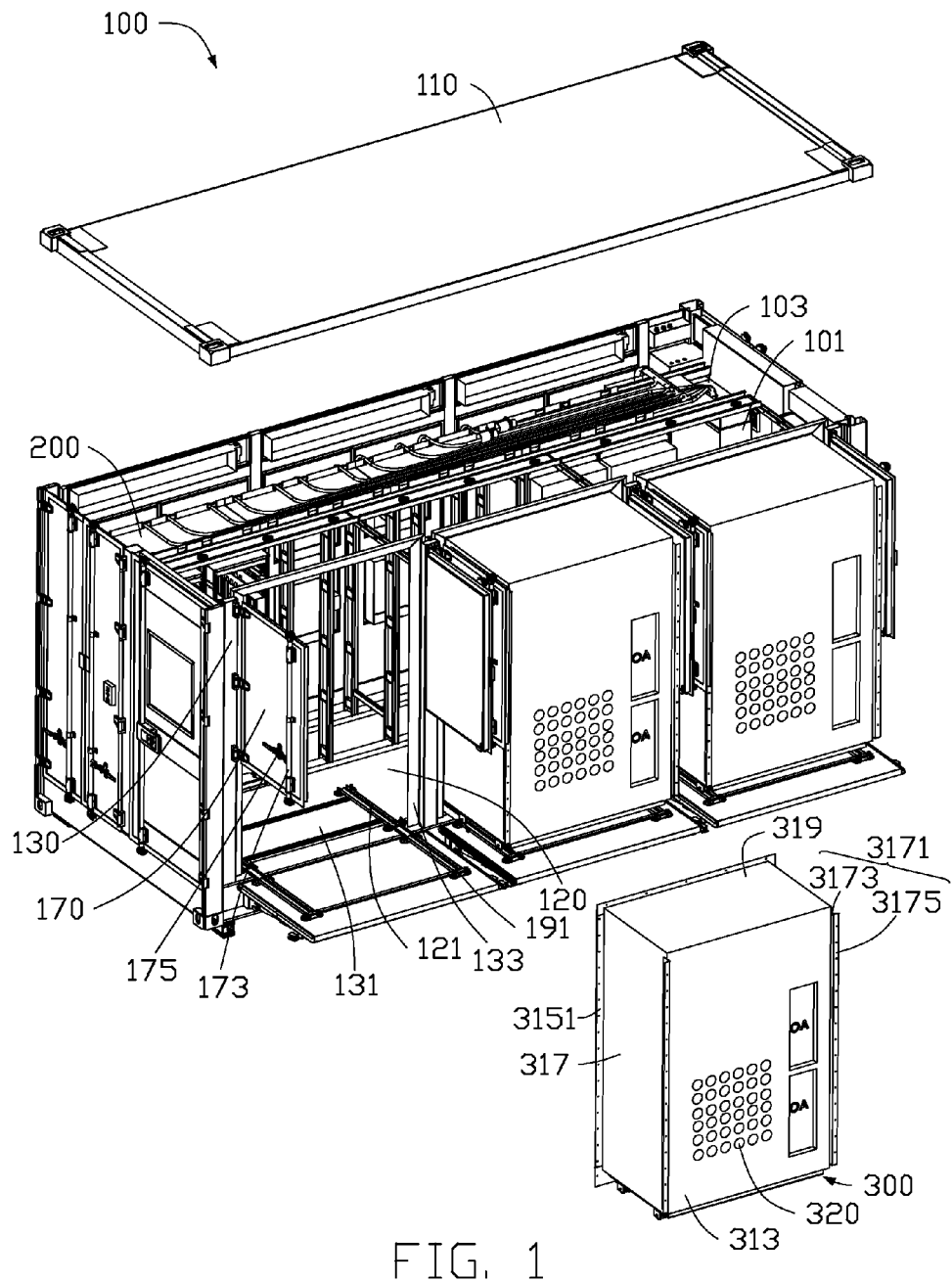
FIG. 1 is an exploded, isometric view of an exemplary embodiment of a container data center, wherein the container data center comprises a plurality of cooling devices and a plurality of support members.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "inside" indicates that at least a portion of a region is partially contained within a boundary formed by the object. The term "comprising," when utilized, means "including, but not necessarily limited to"; it specifically indicates open-ended inclusion or membership in the so-described combination, group, series and the like.

The present disclosure relates to a container data center.

FIG. 1 illustrates an exemplary embodiment of a container data center. The container data center comprises a cabinet 100, a plurality of electronic devices 200, and a plurality of function modules. In this embodiment, the function modules are cooling devices 300.

The cabinet 100 as shown in FIG. 1 is cuboid but other shapes may be used. As shown in FIG. 1, the cabinet 100 comprises a top 110 detachably attached to a top portion, a bottom 120, and a plurality of rectangular sides 130 perpendicular to the bottom 120. The top portion of the cabinet 100 defines a plurality of entrances 101. The bottom 120, the top 110 and the plurality of sides 130 define an interior space 103. A first one of the plurality of sides 130 defines a plurality of spaced rectangular openings 131 along a length of the first one of the plurality of sides 130. Two doors 170 are rotatably attached to upper portions of two opposite side edges of each opening 131. A support member 190 is rotatably attached to a bottom edge of each opening 131. A stopper plate 133 extends respectively from the two side edges of each opening 131 into the opening 131. Each door 170 comprises a latching member 173 formed at an outside, and a handle 175 rotatably mounted to the latching member 173.

The bottom 120 comprises a pair of first slide rails 121 attached to an inside corresponding to each opening 131, in a direction perpendicular to the sides 130.

Figure 2:
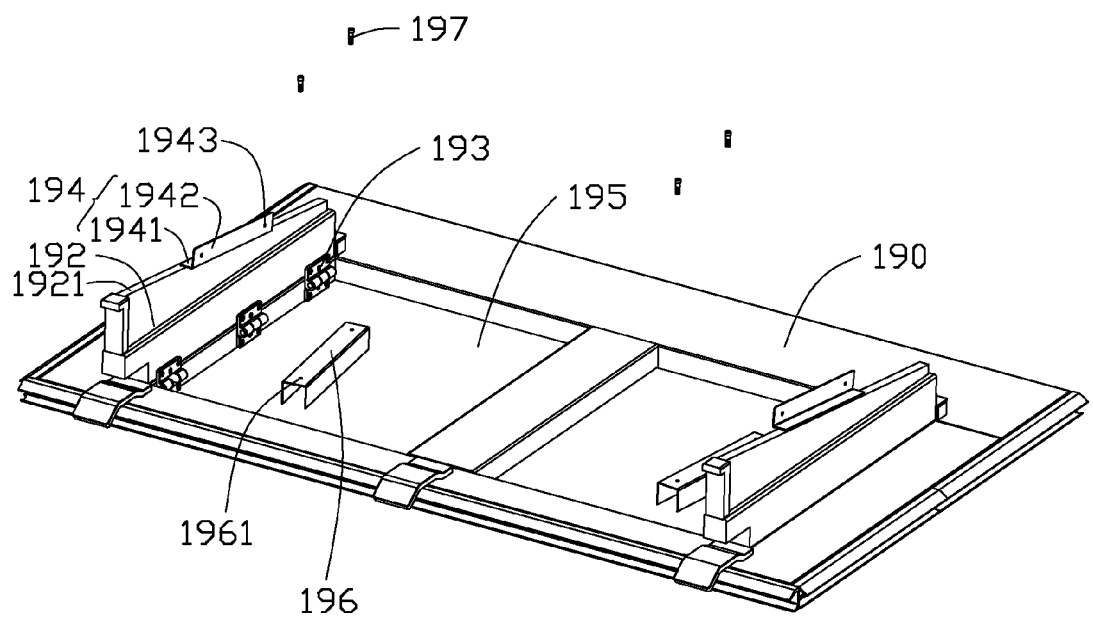
FIG. 2 is a partial, isometric view of one of the support members of FIG. 1, but viewed from another angle.

FIG. 2 illustrates one of the support members 190. Each support member 190 is a plate, and comprises a pair of second slide rails 191 formed at an inside, a pair of blocks 192 rotatably attached to an outside by a plurality of hinges 193, and a pair of recessed portions 195 defined respectively beside the blocks 192. The two recessed portions 195 are located between the two blocks 192. A slanting wall 1921 is formed on a top of each block 192. A first fixing member 194 is attached to the slanting wall 1921. The first fixing member 194 comprises a first tab 1941 attached to the slanting wall 1921, and a second tab 1942 perpendicularly extending out from the first tab 1941. The second tab 1942 defines two through holes 1943. A U-shaped second fixing member 196 is formed in each of the recessed portions 195. Each second fixing member 196 defines two screw holes 1961 in a top portion. Each support members 190 comprises a latching member 173 formed at an outside of each support members 190, and a handle 175 rotatably mounted to the latching member 173.

Figure 3:
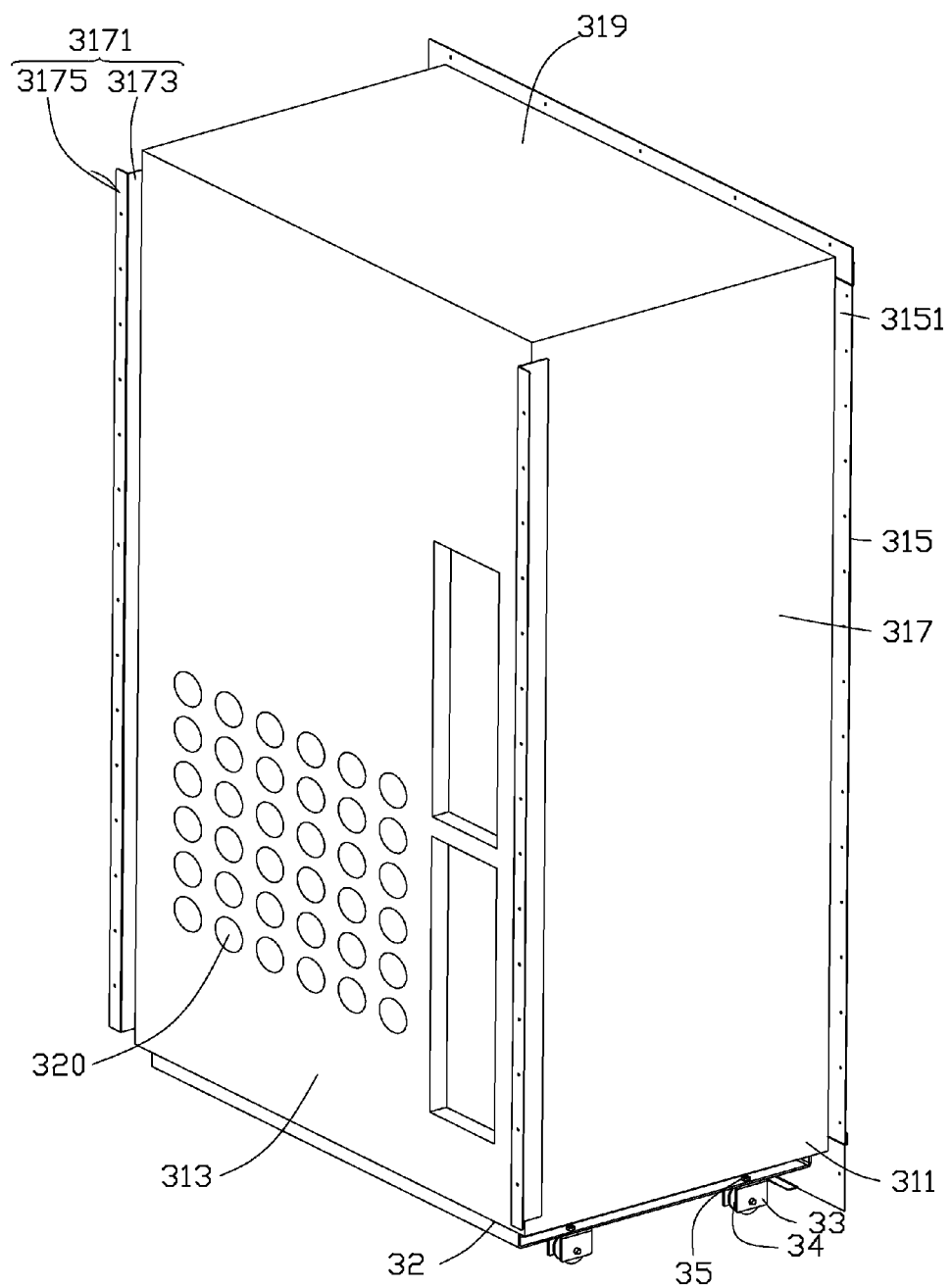
FIG. 3 is an isometric view of one of the cooling devices of FIG. 1, but viewed from another angle.

FIG. 3 illustrates the cooling device 300. The cooling device 300 comprises a bottom wall 311, a front wall 313, a rear wall 315, two side walls 317, and a top wall 319. The front wall 313 and the rear wall 315 each define a plurality of vents 320. Two L-shaped operating members 3171 are respectively attached to the two side walls 317. Each operating member 3171 comprises a first plate 3173 coupled to the side wall 317 and a second plate 3175 perpendicularly extending from one side of the fixing plate 3173 away from the side wall 317. A blocking board 3151 is attached to the rear wall 315.

A hollow frame 32 is mounted on the bottom wall 311. A pair of U-shaped brackets 33 is mounted on each end of a bottom of the frame 32. A wheel 34 is rotatably mounted in each bracket 33. A screw 35 threadedly and vertically extends through the bracket 33. A lower portion of the screw 35 is for abutting against the wheel 34 and an upper portion of the screw 35 extends into the hollow frame 32 for conveniently operation.

Figure 4:
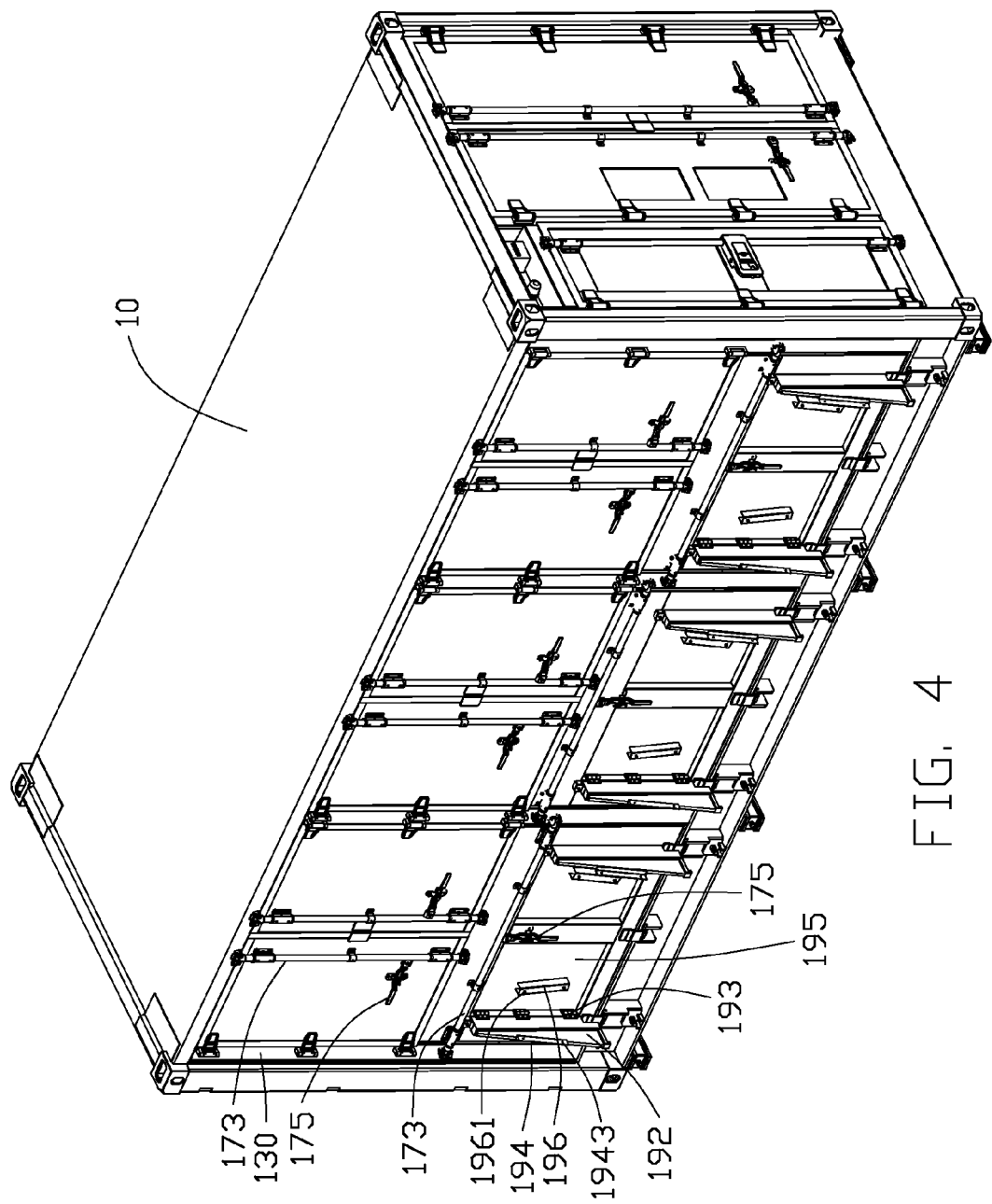
FIG. 4 is an assembled, isometric view of FIG. 1, showing the container data center in a first state.

FIG. 4 illustrates the assembled container data center in a first state. To transport the container data center, the top 110 is removed, and the electronic devices 200 are positionable in a first portion of the defined interior space 103. The cooling devices 300 are installed in the cabinet 100 via the entrances 101 into a second portion of the defined interior space 103 by a crane truck. The screws 35 are screwed to abut against the wheels 34, and the cooling devices 300 are located at the first slide rail 121. Then the top 110 is attached to the cabinet 100, the doors 170 are rotated to abut against the stopper plate 133, and the support members 190 are rotated to abut against the stopper plate 133. The openings 131 are covered by the doors 170 and the support members 190. The handles 175 of the doors 170 and the support member 190 are rotated to fasten the latching member 173 on the sides 130, and the doors 170 and the support member 190 are fixed to the cabinet 100. The blocks 192 are rotated to be received in the corresponding recessed portion 195, and a plurality of screws 197 extends through the through holes 1943 to be fixed in the screw holes 1961. The support blocks 192 are fixed in the recessed portions 195.

Figure 5:
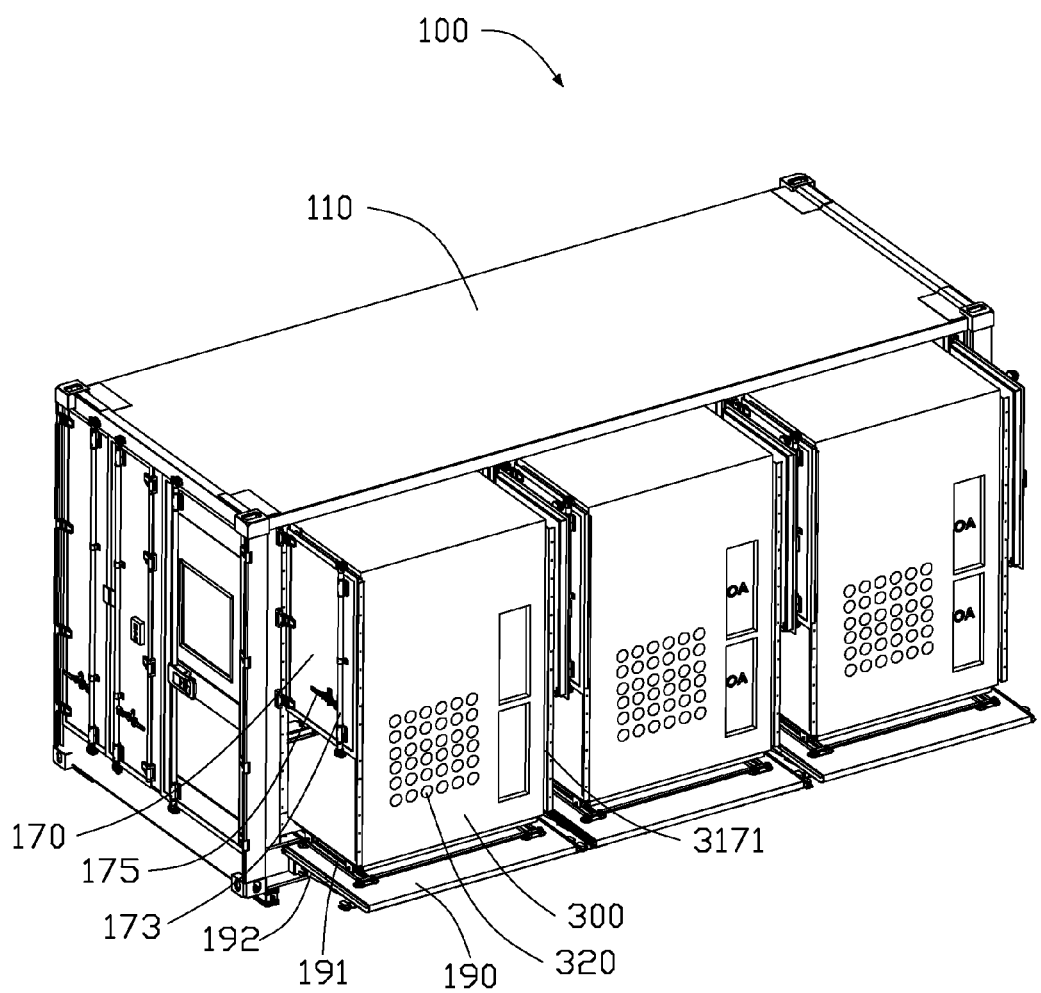
FIG. 5 is similar to FIG. 4, showing the container data center in a second state.

FIG. 5 illustrates the assembled container data center in a second state. When the container data center is in use, the handles 175 of the doors 170 and the support members 190 are rotated to release the latching members 173 from the sides 130. The screws 197 are unscrewed, and the blocks 192 are rotated to be perpendicular to the support member 190. The doors 170 can be rotated to expose the openings 131. The support members 190 are rotated to make the blocks 192 abut against the ground. The inside of the support members 190 are coplanar with the inside of the bottom 120, and the second slide rails 191 are aligned with the corresponding first slide rail 121. The screws 35 are rotated to move away from the wheels 34, and pull the cooling devices 300 outward by operating the operating portions 3175. The cooling devices 300 slide from the first slide rails 121 to a fit position of the second slide rails 191. The screws 35 are screwed to abut against the wheels 34, and the cooling devices 300 are located at the second slide rails 191, to dissipate heat for the electronic devices 200. Meanwhile, the blocking board 3151 of the cooling devices 200 can be stopped by the stopper plates 133 of the cabinet 100, to prevent the cooling devices 300 from sliding out of the cabinet 100.

In other embodiments of the container data center, the first slide rails and the second slide rails can be replaced with a slide groove.

In the embodiment of the container data center, when the cooling devices are located on the first slide rail, the container data center can be transported. When the support members are rotated to abut against the ground, the cooling devices can slide into the second slide rail from the first slide rail, and the cooling devices can dissipate heat for the electronic devices. The container data center is installed quickly.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims.

What is claimed is:

1. A container data center comprising:
    a cabinet comprising a bottom and a plurality of sides, a first one of the plurality of sides defining a plurality of openings, a door rotatably attached to the first one of the plurality of sides beside a top edge of each opening, a support member rotatably attached to the sides near a bottom edge of each opening and located outside the opening; the door and the support member configured to cooperatively cover the opening; and
    a plurality of function modules located on the bottom;
    wherein the door is rotatable to close an upper portion of the opening, and the support member is rotatable to close a lower portion of the opening; the door and the support member is rotated to expose each opening and the support member is aligned with the bottom to allow the function modules to slide on the bottom and the support member.

2. The container data center of claim 1, wherein the bottom comprising a pair of first slide rails corresponding to each opening, each support member comprises a pair of second slide rails formed at an inside thereof and aligned with the corresponding first slide rails, and the function modules are capable sliding on the first slide rails and the second slide rails.

3. The container data center of claim 1, wherein the function modules are a plurality of cooling devices.

4. The container data center of claim 3, wherein each cooling device comprises a bottom wall and a rear wall perpendicular to the bottom wall, a blocking board is attached to the rear wall, and two side edges of each opening respectively extends a stopper plate into the opening to stop the blocking board.

5. The container data center of claim 4, wherein a hollow frame is mounted on the bottom wall of each cooling device, a pair of brackets is mounted to a bottom of the bottom wall and a wheel is rotatably mounted in each bracket to slide on the first slide rails and the second slide rails.

6. The container data center of claim 5, wherein a screw threadedly extends through the bracket and is configured to abut against the wheel.

7. The container data center of claim 4, wherein each cooling device further comprises two side walls perpendicular to the bottom wall, and a front wall perpendicularly attached to a front side of the bottom wall, and two operating members are respectively attached to a front side of the two side walls.

8. The container data center of claim 1, wherein a pair of blocks is rotatably attached to an outside of each support member to be supported on the ground.

9. The container data center of claim 8, wherein an outside of each support member defines a recessed portion therein located between the two blocks, a first fixing member is attached to a top of each of the block, and a second fixing member is formed in each of the recessed portion to fix the first fixing member.

10. The container data center of claim 9, wherein the first fixing member comprises a first tab attached to the block and a second tab perpendicularly extending out from the first tab, the second tab defines two through holes therein, each second fixing member defines two screw holes, and when the block is received in the recessed portion, a plurality of screws extend through the through holes to be fixed in the screw holes to fix the first fixing member to the second fixing member.

\* \* \* \* \*